(12) United States Patent
Choi

(10) Patent No.: US 9,368,481 B2
(45) Date of Patent: Jun. 14, 2016

(54) SEMICONDUCTOR DEVICES AND PACKAGES HAVING THROUGH ELECTRODES

(71) Applicant: SK hynix Inc., Icheon (KR)

(72) Inventor: Hyeong Seok Choi, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/621,156

(22) Filed: Feb. 12, 2015

(65) Prior Publication Data

US 2016/0099229 A1    Apr. 7, 2016

(30) Foreign Application Priority Data

Oct. 6, 2014 (KR) ........................ 10-2014-0134281

(51) Int. Cl.
*H01L 25/00* (2006.01)
*H01L 25/065* (2006.01)
*H01L 23/00* (2006.01)

(52) U.S. Cl.
CPC ............ *H01L 25/0657* (2013.01); *H01L 24/09* (2013.01); *H01L 24/17* (2013.01); *H01L 2224/02175* (2013.01); *H01L 2224/0401* (2013.01); *H01L 2224/17133* (2013.01); *H01L 2225/06513* (2013.01); *H01L 2225/06544* (2013.01)

(58) Field of Classification Search
CPC ...... H01L 25/0657; H01L 24/09; H01L 24/17
See application file for complete search history.

(56) References Cited

U.S. PATENT DOCUMENTS 6,018,189 A * 1/2000 Mizuno ............. H01L 23/49548 257/666
8,575,763 B2 * 11/2013 Yoshida ............... H01L 21/6835 257/621
8,599,596 B2 * 12/2013 Riho ........................ G11C 5/02 257/686
8,659,136 B2 * 2/2014 Youn ........................ G11C 5/02 257/686
8,697,495 B2 * 4/2014 Cheah ................. H01L 25/0657 257/686
8,698,276 B2 * 4/2014 Lee .......................... H01L 22/22 257/529
2002/0028532 A1 * 3/2002 Tsunashima ...... H01L 21/76898 438/106
2006/0125092 A1 * 6/2006 Marshall .................. G02B 6/43 257/723
2008/0303132 A1 * 12/2008 Mohammed ...... H01L 23/49811 257/686
2009/0189293 A1 * 7/2009 Suzuki .............. H01L 23/49827 257/777
2010/0065949 A1 * 3/2010 Thies ................ H01L 21/76898 257/621
2012/0056321 A1 * 3/2012 Pagaila ............. H01L 23/49827 257/737
2015/0084205 A1 * 3/2015 Lin ..................... H01L 23/5384 257/774
2015/0279773 A1 * 10/2015 Fu ..................... H01L 21/76898 257/621

FOREIGN PATENT DOCUMENTS

KR    10-2013-0042938 A    4/2013

* cited by examiner

Primary Examiner — Ida M Soward

(57) ABSTRACT

A semiconductor device includes a substrate having a first surface and a second surface that are opposite to each other, a plurality of through electrodes penetrating the substrate and extending from the first surface to the second surface, frontside bumps disposed on the first surface and connected to odd-numbered through electrodes among the plurality of through electrodes, and backside bumps disposed on the second surface and connected to even-numbered through electrodes among the plurality of through electrodes. Related semiconductor packages, fabrication methods, electronic systems and memory cards are also provided.

16 Claims, 11 Drawing Sheets

SEMICONDUCTOR DEVICES AND PACKAGES HAVING THROUGH ELECTRODES

CROSS-REFERENCE TO RELATED APPLICATION

The present application claims priority under 35 U.S.C 119(a) to Korean Application No. 10-2014-0134281, filed on Oct. 6, 2014, in the Korean intellectual property Office, which is incorporated herein by reference in its entirety as set forth in full.

BACKGROUND

1. Technical Field

Various embodiments of the present disclosure relate to semiconductor devices having through electrodes, semiconductor packages including the same, methods of manufacturing the same, electronic systems including the same, and memory cards including the same.

2. Related Art

Ultra small-sized semiconductor devices with a large capacity are increasingly in demand with the development of smaller and higher performance electronic products. A plurality of semiconductor chips may be assembled in a single semiconductor package to increase a capacity of the semiconductor device. That is, the capacity of the semiconductor device may be readily increased using a multi-chip package technique.

However, even though the multi-chip package technique is used to increase the data storage capacity of the semiconductor device, there may be a limitation in obtaining a sufficient space for electrical connections between the plurality of semiconductor chips in the multi-chip package as the number of the semiconductor chips increases. Recently, through silicon vias (TSVs) have been proposed to resolve the limitation of the multi-chip package technique. The TSVs may be formed to penetrate a plurality of chips at a wafer level, and the chips stacked in the package may be electrically and physically connected to each other by the TSVs. Accordingly, if the TSVs are employed in the packages, the performance and the storage capacity of the packages may be improved.

SUMMARY

Various embodiments are directed to semiconductor devices having through electrodes, semiconductor packages including the same, methods of manufacturing the same, electronic systems including the same, and memory cards including the same.

According to an embodiment, a semiconductor device includes a substrate having a first surface and a second surface that are opposite to each other, a plurality of through electrodes penetrating the substrate to extend from the first surface toward the second surface and being spaced apart from each other, front-side bumps disposed on the first surface and connected to odd-numbered through electrodes among the plurality of through electrodes, and backside bumps disposed on the second surface and connected to even-numbered through electrodes among the plurality of through electrodes.

The first surface of the substrate is a front-side surface adjacent to active regions disposed in the substrate, and wherein the second surface is a backside surface that is opposite to the front-side surface. The odd-numbered through electrodes are not connected to any of the backside bumps disposed on the second surface, and wherein the even-numbered through electrodes are not connected to any of the front-side bumps disposed on the first surface.

Each of the front-side bumps includes a seed metal pattern, a first metal layer and a first contact metal layer which are sequentially stacked on any one of the odd-numbered through electrodes, and wherein each of the backside bumps includes a second metal layer and a second contact metal layer which are sequentially stacked on any one of the even-numbered through electrodes.

The semiconductor device further comprising an insulation layer disposed on the first surface of the substrate, and a plurality of contact pads disposed in the insulation layer and being in contact with each of the through electrodes, respectively, wherein each of the plurality of contact pads includes a conductive material. The plurality of contact pads includes first contact pads alternately arrayed with second contact pads, and wherein the first contact pads are connected to the odd-numbered through electrodes and the second contact pads are connected to the even-numbered through electrodes.

The semiconductor device further comprises first diffusion barrier patterns disposed on surfaces of the contact pads opposite to the substrate, wherein each of the first diffusion barrier patterns includes a nickel material. The semiconductor device further comprises second diffusion patterns that are disposed on the second surface of the substrate and cover ends of the even-numbered through electrodes, wherein each of the second diffusion barrier patterns includes a nickel material.

According to another embodiment, a semiconductor package includes a first semiconductor chip and a second semiconductor chip. The first semiconductor chip includes a first substrate having a first surface and a second surface that are opposite to each other, a plurality of first through electrodes penetrating the first substrate and being spaced apart from each other, a plurality of first front-side bumps disposed on the first surface of the first substrate and connected to first odd-numbered through electrodes among the first through electrodes, and a plurality of first backside bumps disposed on the second surface of the first substrate and connected to first even-numbered through electrodes among the first through electrodes. The second semiconductor chip includes a second substrate having a first surface and a second surface that are opposite to each other, a plurality of second through electrodes penetrating the second substrate and being spaced apart from each other, a plurality of second front-side bumps disposed on the first surface of the second substrate and connected to second odd-numbered through electrodes among the second through electrodes, and a plurality of second backside bumps disposed on the second surface of the second substrate and connected to second even-numbered through electrodes among the second through electrodes. The first and second semiconductor chips are combined with each other so that the first surface of the first substrate faces the second surface of the second substrate.

According to another embodiment, a semiconductor package includes a first semiconductor chip and a second semiconductor chip. The first semiconductor chip includes a first substrate that has a first surface and a second surface, a plurality of first through electrodes that penetrate the first substrate to extend from the first surface toward the second surface, and a plurality of first front-side bumps that are disposed on the first surface of the first substrate and connected to first odd-numbered through electrodes among the first through electrodes. The second semiconductor chip includes a second substrate that has a first surface and a second surface, a plurality of second through electrodes that penetrate the first substrate to extend from the first surface toward the second surface, and a plurality of second front-side bumps that are disposed on the first surface of the second substrate and connected to second even-numbered through electrodes among the second through electrodes. The first and second semiconductor chips are combined with each other so that the first surface of the first substrate faces the first surface of the second substrate.

According to another embodiment, a semiconductor package includes a package substrate, a first semiconductor chip disposed on the package substrate, and at least one additional semiconductor chip stacked on a surface of the first semiconductor chip opposite to the package substrate. The first semiconductor chip includes a substrate having a first surface and a second surface that are opposite to each other, a plurality of through electrodes penetrating the substrate, a plurality of front-side bumps disposed on the first surface and connected to odd-numbered through electrodes among the through electrodes, and a plurality of backside bumps disposed on the second surface and connected to even-numbered through electrodes among the through electrodes. Backside bumps of the at least one additional semiconductor chip are electrically connected to the even-numbered through electrodes of the first semiconductor chip, respectively.

Each of the front-side bumps includes a first metal layer and a first contact metal layer which are sequentially stacked on one of the odd-numbered through electrodes, and each of the backside bumps includes a second metal layer and a second contact metal layer which are sequentially stacked on one of the even-numbered through electrodes.

The first semiconductor chip further includes an insulation layer disposed on the first surface of the substrate; and a plurality of conductive contact pads disposed in the insulation layer to respectively contact the through electrodes, wherein the first surface of the substrates is a front-side surface of the substrate adjacent to active regions defined in the substrate, wherein the second surface of the substrate is a backside surface of the substrate, and wherein the front-side bumps of the first semiconductor chip are disposed on the contact pads of the first semiconductor chip.

According to another embodiment, a method of manufacturing a semiconductor device includes preparing a substrate in which a plurality of through electrodes are disposed, forming a diffusion barrier layer on at least one surface of the substrate, and forming front-side bumps on the diffusion barrier layer disposed on a first surface of the substrate. The front-side bumps are formed to be respectively connected to odd-numbered through electrodes among the through electrodes. Backside bumps are formed on a second surface of the substrate opposite to the front-side bumps. The backside bumps are formed to be respectively connected to even-numbered through electrodes among the through electrodes.

Forming the front-side bumps includes forming a seed metal layer on the diffusion barrier layer, forming a mask pattern on the seed metal layer that exposes portions of the seed metal layer, sequentially forming a metal layer and a contact metal layer on each of the exposed portions of the seed metal layer, removing the mask pattern to expose portions of the seed metal layer in spaces between the metal layers, and etching the seed metal layer using the metal layers and the contact metal layers as etch masks, thereby forming seed metal patterns under the metal layers, wherein each of the front-side bumps includes the seed metal pattern, the metal layer and the contact metal layer which are sequentially stacked.

The odd-numbered through electrodes are not connected to the backside bumps which are formed on the second surface of the substrate, and wherein the even-numbered through electrodes are not connected to the front-side bumps which are formed on the first surface of the substrate.

Forming the diffusion barrier layer is preceded by forming an insulation layer on the first surface of the substrate, and forming conductive contact pads in the insulation layer, wherein the front-side bumps are formed on the conductive contact pads. The diffusion barrier layer is formed to include a nickel material. The metal layer includes a copper material.

According to another embodiment, an electronic system includes a semiconductor device. The semiconductor device includes a substrate having a first surface and a second surface that are opposite to each other, a plurality of through electrodes penetrating the substrate to extend from the first surface toward the second surface and being spaced apart from each other, front-side bumps disposed on the first surface and connected to odd-numbered through electrodes among the plurality of through electrodes, and backside bumps disposed on the second surface and connected to even-numbered through electrodes among the plurality of through electrodes.

According to another embodiment, a memory card includes a semiconductor device. The semiconductor device includes a substrate having a first surface and a second surface that are opposite to each other, a plurality of through electrodes penetrating the substrate to extend from the first surface toward the second surface and being spaced apart from each other, front-side bumps disposed on the first surface and connected to odd-numbered through electrodes among the plurality of through electrodes, and backside bumps disposed on the second surface and connected to even-numbered through electrodes among the plurality of through electrodes.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
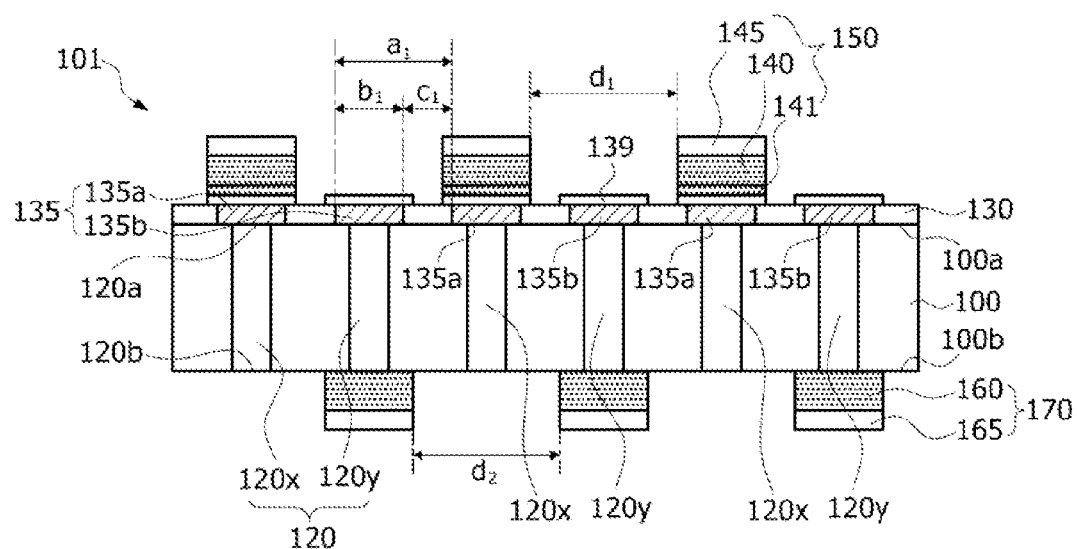
FIG. 1 is a cross-sectional view illustrating a semiconductor device according to an embodiment.

In the following embodiments, it will be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

In the drawings, thicknesses and lengths of components are exaggerated compared to actual physical thickness and intervals for convenience of illustration. In the following description, a detailed explanation of known related functions and constitutions may be omitted to avoid unnecessarily obscuring the subject manner. Furthermore, 'connected/coupled' represents that one component is directly coupled to another component or indirectly coupled through another component. In this specification, a singular form may include a plural form as long as it is not explained as being limited to singular.

FIG. 1 is a cross-sectional view illustrating a semiconductor device 101 according to an embodiment. Referring to FIG. 1, the semiconductor device 101 may include a substrate 100 having a first surface 100a and a second surface 100b that are opposite to each other, a plurality of through electrodes 120 that penetrate the substrate 100 and are spaced apart from each other, front-side bumps 150 disposed on the first surface 100a of the substrate 100 and electrically connected to odd-numbered through electrodes 120x among the plurality of through electrodes 120, and backside bumps 170 disposed on the second surface 100b of the substrate 100 and electrically connected to even-numbered through electrodes 120y among the plurality of through electrodes 120.

In other words, when a plurality of through electrodes 120 are sequentially arranged in a given direction, the first through electrode 120 of the sequence may be referred to as an odd electrode 120x, and the second electrode 120 of the sequence may be referred to as an even electrode 120y. Similarly, subsequent odd-numbered electrodes 120 of the sequence, e.g. the third, fifth and seventh electrodes, are referred to as odd-numbered through electrodes 120x, and subsequent even-numbered electrodes 120 are referred to as even-numbered electrodes 120y. Put another way, when a plurality of electrodes 120 are sequentially arranged in one direction, the electrodes 120 include odd-numbered electrodes 120x that alternate with even-numbered electrodes 120y. Each electrode in the sequence is alternately an odd-numbered electrode 120x and an even-numbered electrode 120y.

The first surface 100a of the substrate 100 may correspond to a front-side surface that is adjacent to active regions defined in the substrate 100, and the second surface 100b of the substrate 100 may correspond to a backside surface opposing the first surface 100a. Transistors (not shown) including source/drain regions and gate electrode may be disposed on the first surface 100a, and circuit patterns (not shown) such as bit lines may also be disposed on the first surface 100a.

The through electrodes 120 may extend from the first surface 100a of the substrate 100 to the second surface 100b of the substrate 100. Each of the through electrodes 120 may include a copper (Cu) material. Each of the through electrodes 120 may include a first end surface 120a adjacent to the first surface 100a of the substrate 100 and a second end surface 120b adjacent to the second surface 100b of the substrate 100.

An insulation layer 130 may be disposed on the first surface 100a of the substrate 100. Contact pads 135 may be disposed in the insulation layer 130 and may be electrically connected to the first end surfaces 120a of the through electrodes 120. The contact pads 135 may include first contact pads 135a and second contact pads 135b which are alternately arrayed. Each of the first and second contact pads 135a and 135b may include a conductive material, for example, a metal material such as a copper (Cu) material or an aluminum (Al) material.

The first contact pads 135a among the contact pads 135 may be electrically connected to the front-side bumps 150 which are connected to the odd-numbered through electrodes 120x, respectively. Each of the front-side bumps 150 may be configured to include a first seed metal pattern 141, a first metal layer 140 and a first contact metal layer 145 which are sequentially stacked on any one of the first contact pads 135a. The first seed metal pattern 141 and the first metal layer 140 may have a pillar shape and may include a copper (Cu) material. The first contact metal layer 145 may include a silver (Ag) material or a tin (Sn) material.

Diffusion barrier patterns 139 may be additionally disposed on the contact pads 135, respectively. The diffusion barrier patterns 139 may prevent copper atoms in the front-side bumps 150 from migrating into the contact pads 135. Each of the diffusion barrier patterns 139 may include a nickel (Ni) material.

Since the front-side bumps 150 are selectively connected to only the first contact pads 135a, the front-side bumps 150 may be disposed only on the odd-numbered through electrodes 120x, as illustrated in FIG. 1.

The backside bumps 170 may be disposed on the second surface 100b of the substrate 100 and may be connected to the second end surfaces 120b of the through electrodes 120. The backside bumps 170 may be connected to only the even-numbered through electrodes 120y. That is, the backside bumps 170 may be connected to the even-numbered through electrodes 120y which are not electrically connected to the front-side bumps 150 at the first surface 100a. Thus, the second end surfaces 120b of the odd-numbered through electrodes 120x not connected to the backside bumps 170 may be exposed at the second surface 100b of the substrate 100.

Each of the backside bumps 170 may include a second metal layer 160 and a second contact metal layer 165 which are sequentially stacked on any one of the second end surfaces 120b of the even-numbered through electrodes 120y. The second metal layer 160 may be formed to have a pillar shape and may include a copper (Cu) material. The second contact metal layer 165 may include a silver (Ag) material or a tin (Sn) material. Although not shown in the drawings, each of the backside bumps 170 may further include a second seed metal pattern which is disposed between the second metal layer 160 and the even-numbered through electrode 120y. The second seed metal pattern may include a copper (Cu) material.

A pitch a1 of the contact pads 135 may be a sum of a width b1 of each contact pad 135 and a distance c1 between adjacent contact pads 135. In general, if the semiconductor device 101 becomes more highly integrated, the pitch a1 of the contact pads 135 may be reduced. In such a case, there may be a limitation in forming the front-side bumps 150 (or the backside bumps 170) on all of the contact pads 135 with an etch process. For example, in order to form the front-side bumps 150 (or the backside bumps 170), a seed metal layer such as a copper layer may be formed on the substrate including the contact pads 135 and the front-side bumps 150 connected to the contact pads 135 may be formed of a copper material using a electroplating process.

Subsequently, portions of the seed metal layer between the front-side bumps 150 may be removed to electrically disconnect the front-side bumps 150 from each other. The seed metal layer between the front-side bumps 150 may be removed using a wet etch process. However, if the pitch a1 of the contact pads 135 is reduced, a distance between the front-side bumps 150 may also be reduced. Thus, etchant used in the wet etch process may be non-uniformly supplied onto the seed metal layer between the front-side bumps 150. Accordingly, it may be difficult to completely remove the seed metal layer between the front-side bumps 150. If the seed metal layer between the front-side bumps 150 is not completely removed, leakage current may flow between the front-side bumps 150 to degrade the reliability of the semiconductor device 101.

However, according to an embodiment, the front-side bumps 150 are only electrically connected to the odd-numbered through electrodes 120x through the first contact pads 135a on the first surface 100a of the substrate 100, and the backside bumps 170 are only electrically connected to the even-numbered through electrodes 120y on the second surface 100b of the substrate 100. That is, the second contact pads 135b may not be connected to the front-side bumps 150 and may be disposed on the first surface 100a. Thus, a first distance d1 between the adjacent front-side bumps 150 may be greater than the distance c1 between adjacent contact pads 135.

In addition, the first distance d1 between adjacent front-side bumps 150 may be greater than the width b1 of each contact pad 135. Accordingly, although the integration density of the semiconductor device 101 increases to reduce the pitch a1 of the contact pads 135, the first distance d1 between adjacent front-side bumps 150 may be greater than the width b1 of each contact pad 135. As a result, it may be possible to completely and uniformly remove the seed metal layer between the front-side bumps 150.

Moreover, a second distance d2 between the backside bumps 170 disposed on the second surface 100b of the substrate 100 may also be greater than a width of each backside bump 170. Thus, it may be possible to completely and uniformly remove portions of a seed metal layer disposed between the backside bumps 170.

Figure 2:
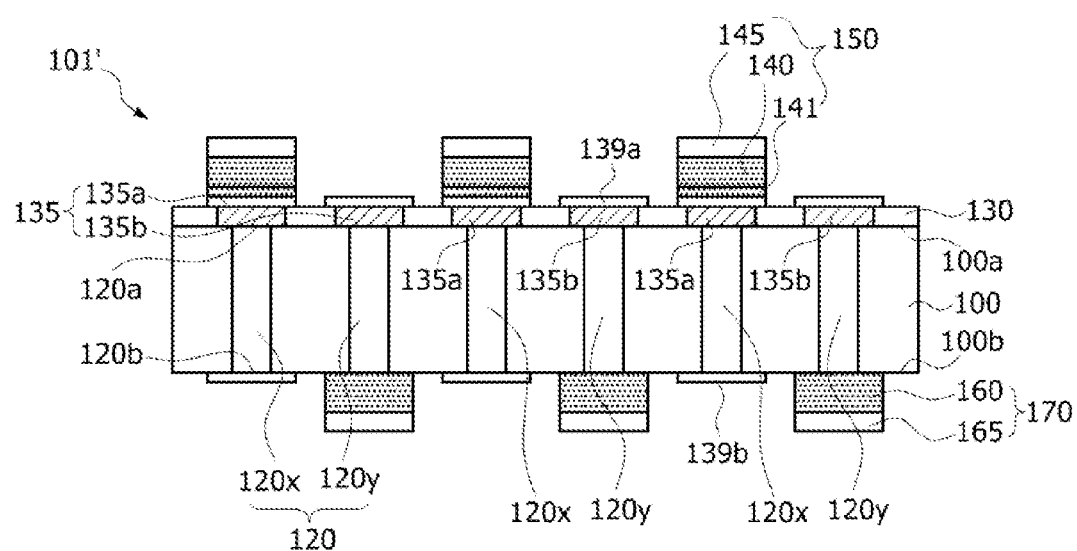
FIG. 2 is a cross-sectional view illustrating a semiconductor device according to another embodiment.

FIG. 2 is a cross-sectional view illustrating a semiconductor device 101' according to another embodiment. Some of the information discussed with reference to FIG. 1 will be omitted or briefly mentioned in this embodiment.

Referring to FIG. 2, the semiconductor device 101' may include a plurality of through electrodes 120 that penetrate a substrate 100 having a first surface 100a and a second surface 100b. The plurality of through electrodes 120 may extend from the first surface 100a to the second surface 100b. Front-side bumps 150 may be disposed on the first surface 100a of the substrate 100 and may be electrically connected to odd-numbered through electrodes 120x among the plurality of through electrodes 120.

An insulation layer 130 may be disposed on the first surface 100a of the substrate 100. Contact pads 135 including first contact pads 135a and second contact pads 135b may be disposed in the insulation layer 130. The contact pads 135 may electrically connect the through electrodes 120 to the front-side bumps 150. Each of the contact pads 135 may include a copper (Cu) material. The first contact pads 135a may be electrically connected to the front-side bumps 150 disposed only on the odd-numbered through electrodes 120x.

First diffusion barrier patterns 139a may be additionally disposed on the contact pads 135. The first diffusion barrier patterns 139a may prevent copper atoms in the front-side bumps 150 from migrating into the contact pads 135. Each of the first diffusion barrier patterns 139a may include a nickel (Ni) material.

Backside bumps 170 may be disposed on the second surface 100b of the substrate 100 and may be electrically connected to even-numbered through electrodes 120y among the plurality of through electrodes 120. The backside bumps 170 may be electrically connected to only the even-numbered through electrodes 120y among the plurality of through electrodes 120. That is, the backside bumps 170 may be electrically connected to only the even-numbered through electrodes 120y which are not connected to the front-side bumps 150.

Second diffusion barrier patterns 139b may be disposed on second end surfaces 120b of the odd-numbered through electrodes 120x which are not connected to the backside bumps 170. The second diffusion barrier patterns 139b may suppress or prevent copper atoms in the odd-numbered through electrodes 120x from being diffused into solder when the odd-numbered through electrodes 120x are bonded to the solder in a subsequent process.

Figure 3:
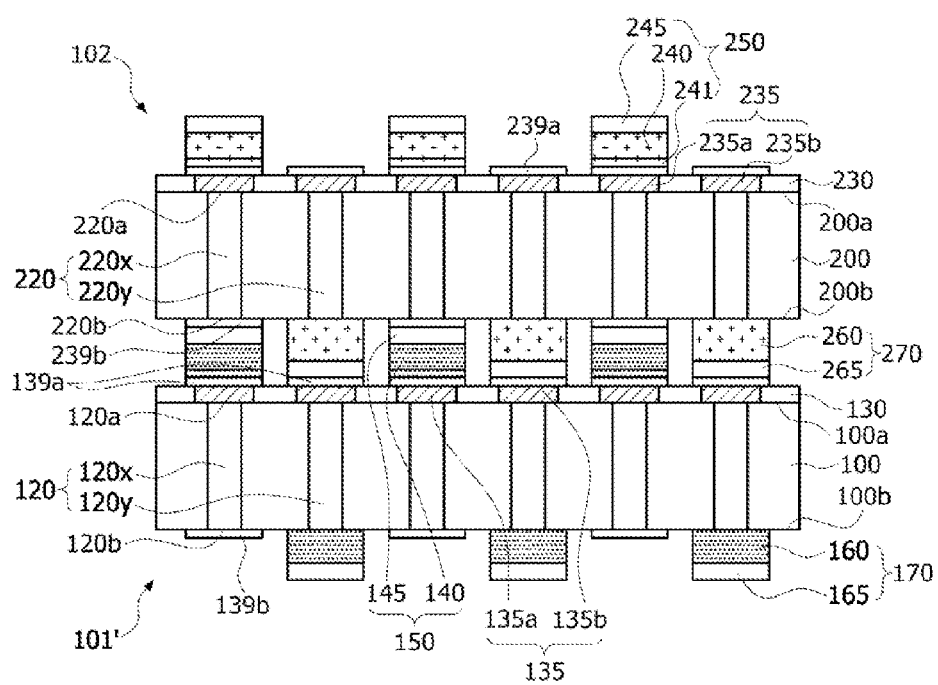
FIG. 3 is a cross-sectional view illustrating a semiconductor package including the semiconductor device of FIG. 2.

FIG. 3 is a cross-sectional view illustrating a semiconductor package including the semiconductor device of FIG. 2. Referring to FIG. 3, the semiconductor package may include a first semiconductor device 101' and a second semiconductor device 102 which are sequentially stacked. The first semiconductor device 101' may correspond to the semiconductor device 101' illustrated in FIG. 2, and the second semiconductor device 102 may also have substantially the same configuration as the semiconductor device 101' illustrated in FIG. 2. Thus, some explanations describing FIGS. 1 and 2 will be omitted or briefly mentioned in this embodiment.

The second semiconductor device 102 may include a substrate 200 having a first surface 200a and a second surface 200b that are opposite to each other, a plurality of through electrodes 220 that penetrate the substrate 200 and are spaced apart from each other, front-side bumps 250 disposed on the first surface 200a of the substrate 200 and electrically connected to odd-numbered through electrodes 220x among the plurality of through electrodes 220, and backside bumps 270 disposed on the second surface 200b of the substrate 200 and electrically connected to even-numbered through electrodes 220y among the plurality of through electrodes 220. The second semiconductor device 102 may further include first diffusion barrier patterns 239a disposed on first end surfaces 220a of the even-numbered through electrodes 220y adjacent to the first surface 200a of the substrate 200 and second diffusion barrier patterns 239b disposed on second end surfaces 220b of the odd-numbered through electrodes 220x adjacent to the second surface 200b of the substrate 200.

An insulation layer 230 may be disposed on the first surface 200a of the substrate 200. Contact pads 235 may be disposed in the insulation layer 230 and may contact the first end surfaces 220a of the through electrodes 220. The contact pads 235 may include first contact pads 235a and second contact pads 235b which are alternately arrayed. The first contact pads 235 may electrically connect the odd-numbered through electrodes 220x to the front-side bumps 250.

Each of the front-side bumps 250 of the second semiconductor device 102 may include a first seed metal pattern 241, a first metal layer 240 and a first contact metal layer 245 which are sequentially stacked on any one of the first contact pads 235a. Each of the backside bumps 270 may include a second metal layer 260 and a second contact metal layer 265 which are sequentially stacked on any one of the second end surfaces 220b of the even-numbered through electrodes 220y.

The second semiconductor device 102 may be disposed on the first semiconductor device 101' such that the first diffusion barrier patterns 139a of the first semiconductor device 101' are combined with the backside bumps 270 of the second semiconductor device 102 and the second diffusion barrier patterns 139b of the second semiconductor device 102 are combined with the front-side bumps 150 of the first semiconductor device 101'. Thus, a semiconductor package according to the present embodiment may have a structure in which the front-side bumps 150 of the first semiconductor device 101' and the backside bumps 270 of the second semiconductor device 102 are alternately arrayed in a space between the substrate 100 and the substrate 200. In addition, a distance (corresponding to the first distance d1 of FIG. 1) between the front-side bumps 150 of the first semiconductor device 101' may be greater than a width of each contact pad 135. Thus, the second semiconductor device 102 may be readily combined with the first semiconductor device 101'.

Figure 4:
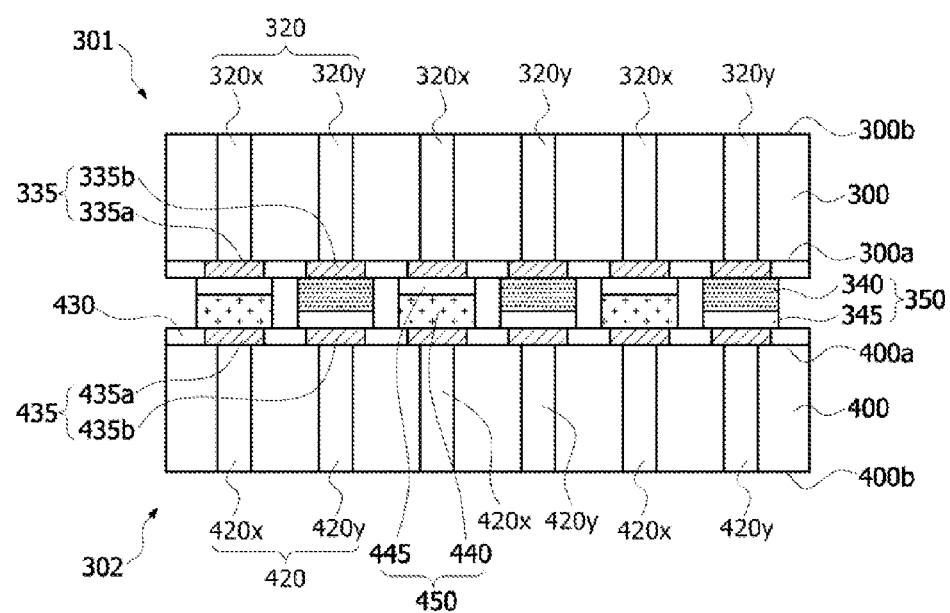
FIG. 4 is a cross-sectional view illustrating a semiconductor package according to another embodiment.

FIG. 4 is a cross-sectional view illustrating a semiconductor package according to another embodiment.

Referring to FIG. 4, the semiconductor package according to the present embodiment may include a third semiconductor device 301 and a fourth semiconductor device 302 which are combined with each other. The third semiconductor device 301 may include a substrate 300 having a first surface 300a and a second surface 300b that are opposite to each other and a plurality of through electrodes 320 penetrating the substrate 300. Odd-numbered through electrodes 320x among the plurality of through electrodes 320 may be connected to first contact pads 335a of contact pads 335, and even-numbered through electrodes 320y among the plurality of through electrodes 320 may be connected to second contact pads 335b of the contact pads 335. The third semiconductor device 301 may further include front-side bumps 350 disposed on the first surface 300a of the substrate 300 and electrically connected to the even-numbered through electrodes 320y via the second contact pads 335b.

The fourth semiconductor device 302 may include a substrate 400 having a first surface 400a and a second surface 400b that are opposite to each other and a plurality of through electrodes 420 penetrating the substrate 400. Odd-numbered through electrodes 420x among the plurality of through electrodes 420 may be connected to first contact pads 435a of contact pads 435, and even-numbered through electrodes 420y among the plurality of through electrodes 420 may be connected to second contact pads 435b of the contact pads 435. The fourth semiconductor device 302 may further include front-side bumps 450 disposed on the first surface 400a of the substrate 400 and electrically connected to the odd-numbered through electrodes 420x via the first contact pads 435a. Each of the front-side bumps 350 may include a first metal layer 340 and a first contact metal layer 345 which are sequentially stacked on any one of the second contact pads 335b, and each of the front-side bumps 450 may include a first metal layer 440 and a first contact metal layer 445 which are sequentially stacked on any one of the first contact pads 435a.

The third and fourth semiconductor devices 301 and 302 may be combined with each other such that the first surface 300a of the substrate 300 faces the first surface 400a of the substrate 400. Thus, the first contact pads 335a of the third semiconductor device 301 may be combined with the front-side bumps 450 of the fourth semiconductor device 302, and the second contact pads 435b of the fourth semiconductor device 302 may be combined with the front-side bumps 350 of the third semiconductor device 301.

FIGS. 5 to 16 are cross-sectional views illustrating a method of manufacturing a semiconductor package according to an embodiment.

Figure 5:
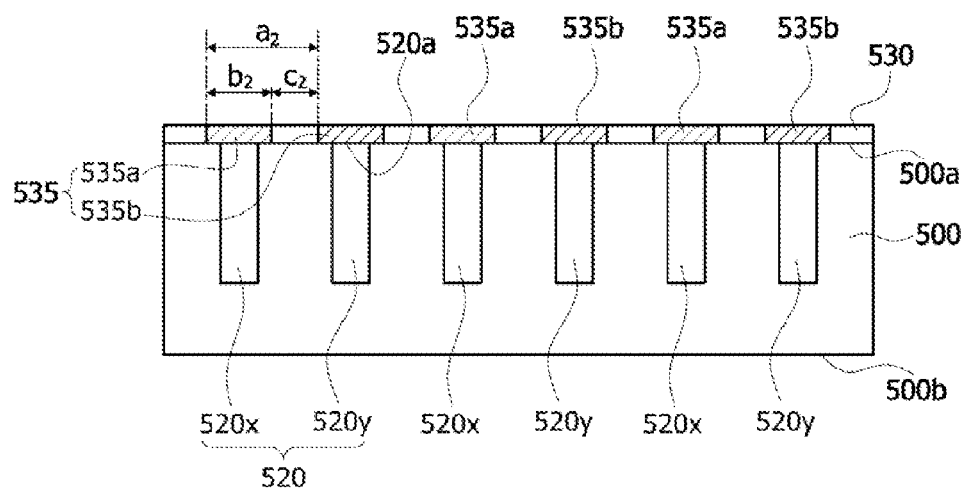
FIGS. 5 to 16 are cross-sectional views illustrating a method of manufacturing a semiconductor package according to an embodiment.

Referring to FIG. 5, a semiconductor substrate 500 including through electrodes 520 therein may be provided.

The semiconductor substrate 500 may have a first surface 500a and a second surface 500b that are opposite to each other. The first surface 500a of the semiconductor substrate 500 may correspond to a front side surface of the semiconductor substrate 500, and the second surface 500b of the semiconductor substrate 500 may correspond to a backside surface of the semiconductor substrate 500. In the present embodiment, the front side surface of the semiconductor substrate 500 may be regarded as surfaces of active regions in which active elements or passive elements are formed, and the backside surface of the semiconductor substrate 500 may be regarded as an opposite surface to the front side surface. The semiconductor substrate 500 may be a substrate which is used in fabrication of semiconductor memory devices, semiconductor logic devices, photo devices or display units. In the present embodiment, the semiconductor substrate 500 may be a silicon substrate, but embodiments are not limited thereto.

Transistors (not shown) including gate electrodes and source/drain regions may be formed on the first surface 500a of the semiconductor substrate 500 and in the active regions of the semiconductor substrate 500. In addition, circuit patterns such as bit lines (not shown) may also be formed on the first surface 500a of the semiconductor substrate 500.

The through electrodes 520, for example, through silicon vias (TSVs), may be formed in the semiconductor substrate 500, as described above. The through electrodes 520 may be formed in trenches that extend from the first surface 500a toward the second surface 500b. The through electrodes 520 may be formed of a metal material. In some embodiments, the trenches may be formed using a laser drilling process. After forming the trenches, the through electrodes 520 may be formed by depositing a seed metal layer (not shown) on inner surfaces of the trenches and by filling the trenches surrounded by the seed metal layer with a metal layer. The metal layer filling the trenches may include a copper (Cu) layer, a silver (Ag) layer or a tin (Sn) layer. The through electrodes 520 may be formed to be spaced apart from each other by a predetermined distance. Each of the through electrodes 520 may include a first end surface 520a which is coplanar with the first surface 500a of the semiconductor substrate 500. The through electrodes 520 may include odd-numbered through electrodes 520x and even-numbered through electrodes 520y.

An insulation layer 530 may be formed on the first surface 500a of the semiconductor substrate 500, and contact pads 535 may be formed in the insulation layer 530. The contact pads 535 may be formed to contact the first end surfaces 520a of the through electrodes 520. In some embodiments, the contact pads 535 may be formed by depositing the insulation layer 530 on the first surface 500a of the semiconductor substrate 500, by patterning the insulation layer 530 to form openings that expose the first end surfaces 520a of the through electrodes 520, and by filling the openings with a conductive material. The conductive material filling the openings may include a copper (Cu) material. The contact pads 535 may include first contact pads 535a connected to the odd-numbered through electrodes 520x and second contact pads 535b connected to the even-numbered through electrodes 520y.

A pitch a2 of the contact pads 535 may correspond to a sum of a width b2 of each contact pad 535 and a distance c2 between the adjacent contact pads 535. If the semiconductor package is scaled down, the pitch a2 of the contact pads 535 may be reduced.

Figure 6:
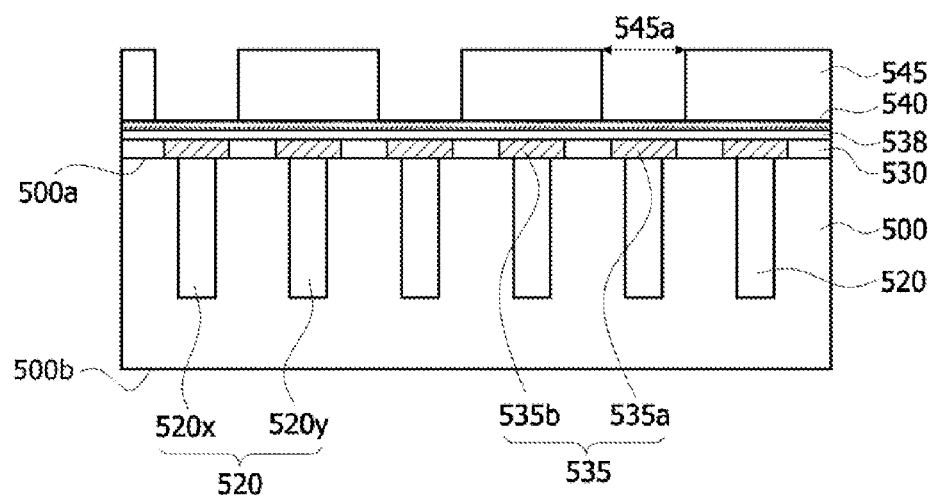

Referring to FIG. 6, a diffusion barrier layer 538 may be formed on the first surface 500a of the semiconductor substrate 500. A semiconductor device manufactured according to the present embodiment may be combined with another semiconductor device to form a semiconductor package. That is, some of the contact pads 535 may directly contact solder portions of backside bumps of the other semiconductor device. In such a case, if the contact pads 535 or the through electrodes 520 are formed of a copper (Cu) material, copper atoms in the contact pads 535 or the through electrodes 520 may be diffused into the solder portions of the backside bumps of the other semiconductor device. However, the diffusion barrier layer 538 may prevent the copper atoms in the contact pads 535 or the through electrodes 520 from being diffused into the solder portions of the backside bumps of the other semiconductor device even though the semiconductor device according to the present embodiment is combined with another semiconductor device.

The diffusion barrier layer 538 may be formed to include a nickel (Ni) material. The diffusion barrier layer 538 may be formed on the insulation layer 530 and the contact pads 535.

A first seed metal layer 540 may be formed on the diffusion barrier layer 538. Although not shown in the drawings, an adhesion layer may be formed on the diffusion barrier layer 538 before the first seed metal layer 540 is formed. The adhesion layer may be formed to enhance an adhesive strength between the diffusion barrier layer 538 and the first seed metal layer 540. The adhesion layer may be formed to include at least one selected from the group consisting of a titanium (Ti) layer, a tungsten (W) layer and a titanium tungsten (TiW) layer. After forming the adhesion layer, the first seed metal layer 540 may be formed on the adhesion layer. The first seed metal layer 540 may be formed of a copper (Cu) layer using a chemical vapor deposition (CVD) process or a physical vapor deposition (PVD) process.

Subsequently, a first mask pattern 545 including first openings 545a may be formed on the first seed metal layer 540. The openings 545a of the first mask pattern 545 may define regions where front-side bumps are formed. Specifically, a photoresist material may be coated on the first seed metal layer 540, and an exposure step and a development step may be applied to the photoresist material to form the first mask pattern 545 including the first openings 545a. The first mask pattern 545 may selectively expose portions of the first seed metal layer 540 through the first openings 545a, and front-side bumps may be selectively formed on the exposed portions of the first seed metal layer 540 in a subsequent process. The first mask pattern 545 may be formed such that the first openings 545a are disposed on the first contact pads 535a.

Figure 7:
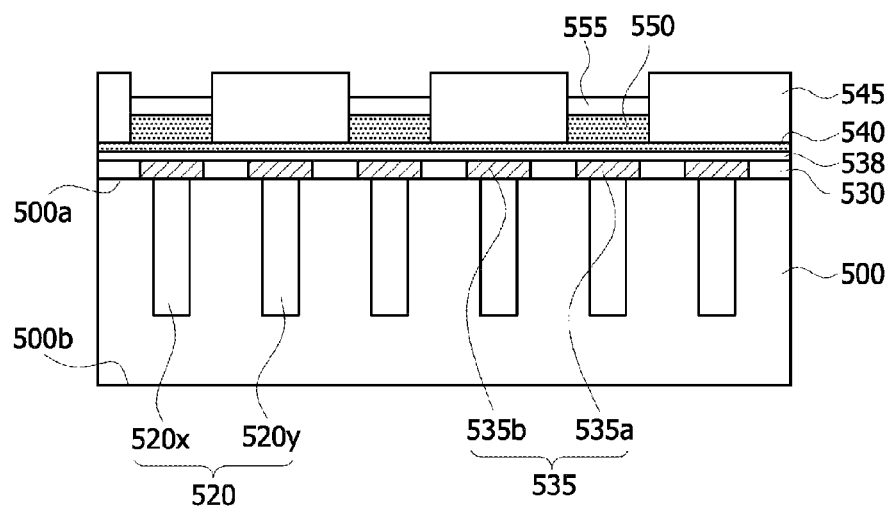

Referring to FIG. 7, a first metal layer 550 and a first contact metal layer 555 may be sequentially formed on each of the exposed portions of the first seed metal layer 540. The first metal layer 550 and the first contact metal layer 555 may be formed using an electroplating process. In such a case, the first metal layer 550 and the first contact metal layer 555 may be selectively grown on each of the exposed portions of the first seed metal layer 540. The first metal layer 550 may be formed to include a copper (Cu) material, and the first contact metal layer 555 may be formed to include a silver (Ag) material or a tin (Sn) material.

Figure 8:
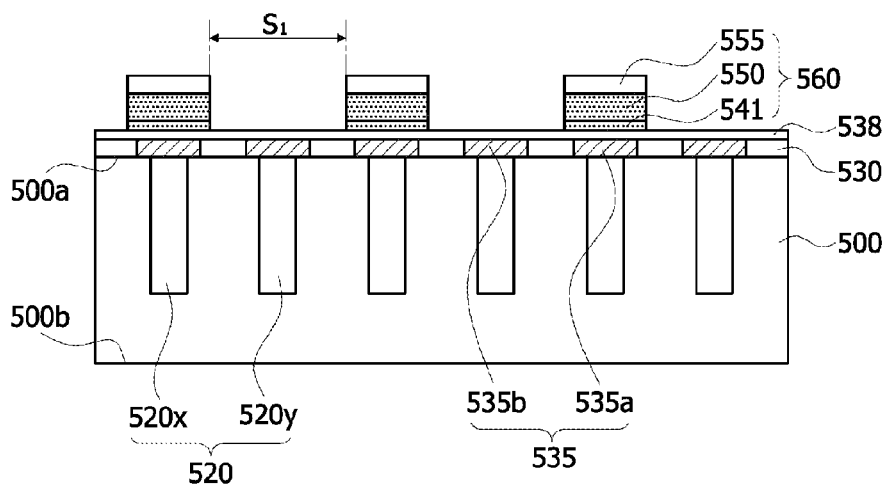

Referring to FIG. 8, the first mask pattern (545 of FIG. 7) may be removed using an ashing process or a strip process. As a result, portions of the first seed metal layer 540 covered with the first mask pattern 545 may be exposed. Subsequently, the exposed portions of the first seed metal layer 540 may be removed using an etch process to form first seed metal patterns 541 under the first metal layers 550. The etch process may be performed using a blanket etch technique without use of any photo masks. The etch process may be performed using a wet etch process. The etch process may be performed to remove the portions of the first seed metal layer 540 that were exposed by removing the first mask pattern 545. That is, the etch process may selectively remove the portions of the first seed metal layer 540 which are disposed between neighboring stacks of first metal layer 550 and the first contact metal layer 555.

As a result of the etch process, front-side bumps 560 may be formed on the first contact pads 535a, respectively. Each of the front-side bumps 560 may be formed to include the first seed metal pattern 541, the first metal layer 550 and the first contact metal layer 555 which are sequentially stacked. Accordingly, portions of the diffusion barrier layer 538 may be exposed between the front-side bumps 560. A first distance S1 between the first metal layers 550 may be greater than a width of each contact pad 535. Thus, the exposed portions of the diffusion barrier layer 538 between the first metal layers 550 may be uniformly and readily removed even though a pitch of the contact pads 535 is reduced.

Figure 9:
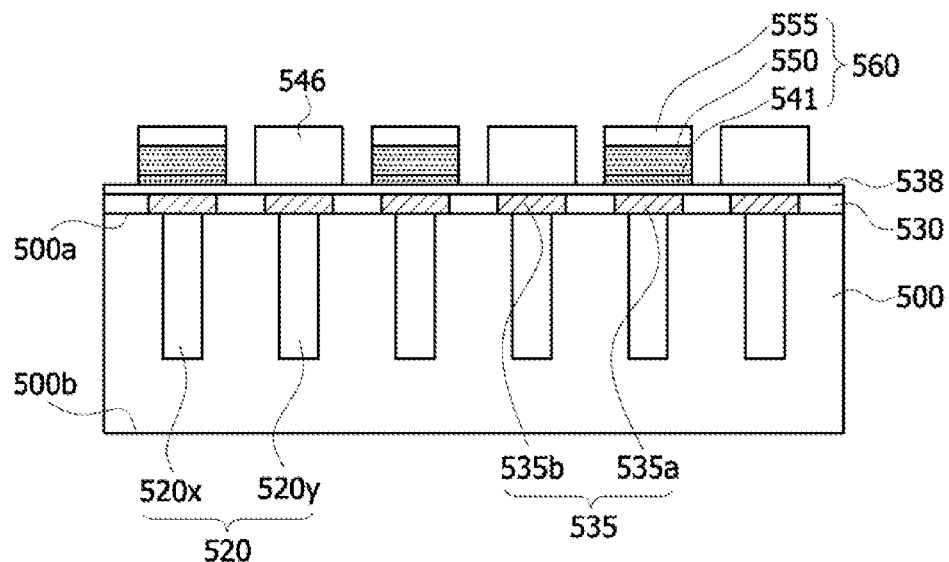

Referring to FIG. 9, a second mask pattern 546 may be formed on the diffusion barrier layer 538 between the front-side bumps 560. The second mask pattern 546 may be formed by coating a photoresist material on the diffusion barrier layer 538 and the front-side bumps 560 and by applying a photolithography process (including an exposure step and a development step) to the photoresist material. The second mask pattern 546 may be formed to overlap with the second contact pads 535b.

Figure 10:
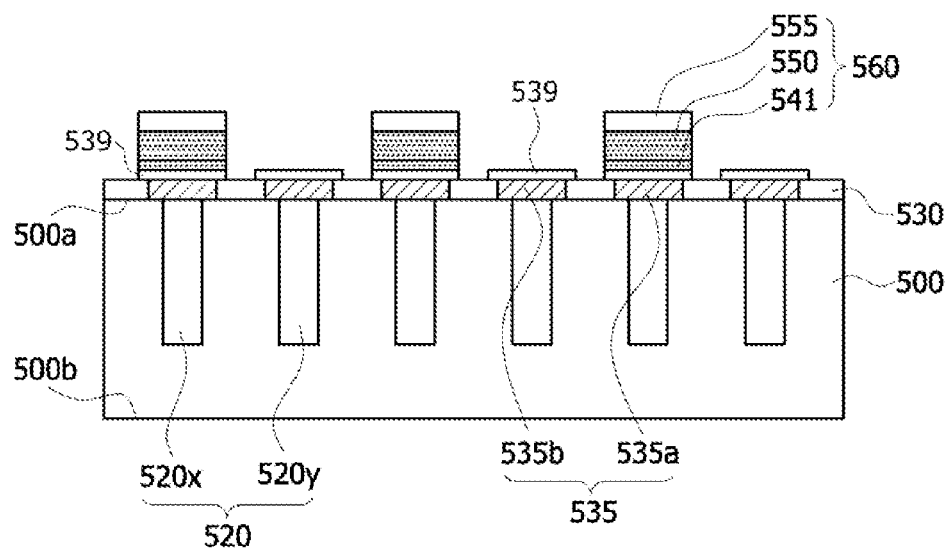

Referring to FIG. 10, using the second mask pattern 546 and the front-side bumps 560 as etch masks, the diffusion barrier layer 538 may be etched to form diffusion barrier patterns 539. The barrier patterns 539 may be formed to cover the first and second contact pads 535a and 535b.

Figure 11:
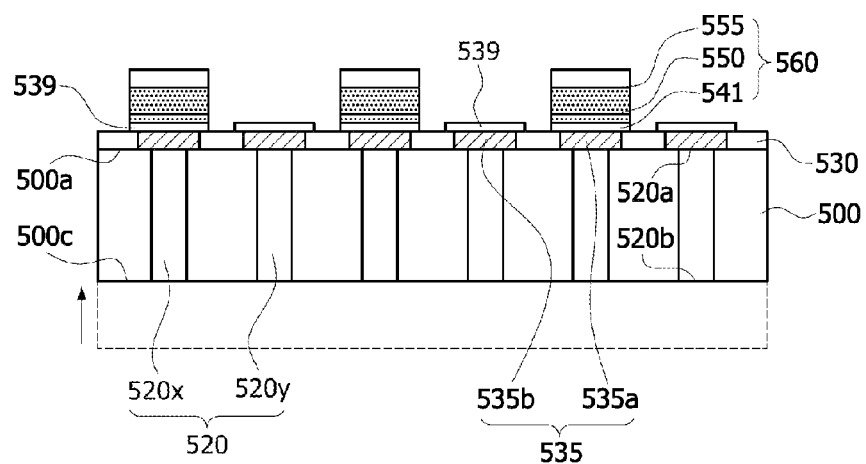

Referring to FIG. 11, a backside portion of the semiconductor substrate 500 may be removed by a predetermined thickness to expose second end surfaces 520b of the through electrodes 520 opposite to the first end surfaces 520a. Specifically, at least one of a grinding process and a chemical mechanical polishing (CMP) process may be applied to the second surface 500b of the semiconductor substrate 500 to expose the second end surfaces 520b of the through electrodes 520. As a result, the initial second surface 500b of the semiconductor substrate 500 may be recessed to form a second surface 500c which is coplanar with the second end surfaces 520b of the through electrodes 520.

Figure 12:
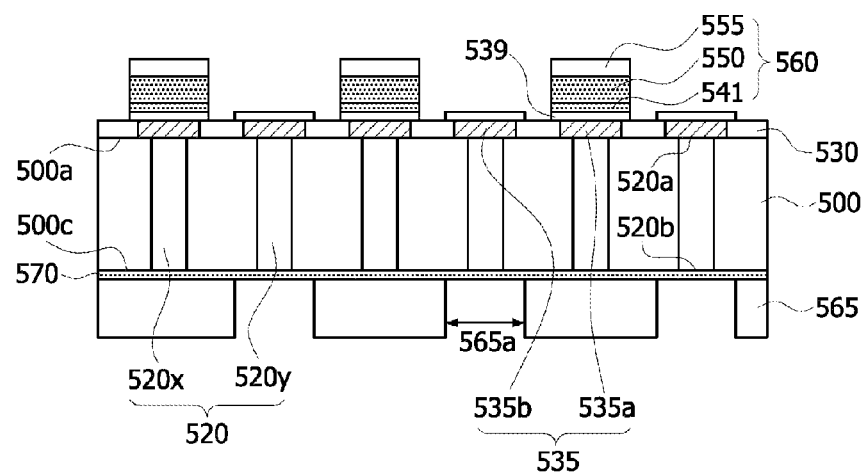

Referring to FIG. 12, a second seed metal layer 570 may be formed on the recessed second surface 500c of the semiconductor substrate 500 and the second end surfaces 520b of the through electrodes 520. The second seed metal layer 570 may be formed of a copper (Cu) material using a CVD process or a PVD process. A mask pattern 565 may be formed on a surface of the second seed metal layer 570 opposite to the semiconductor substrate 500. The mask pattern 565 may be formed to have openings 565a that define regions where backside bumps are formed. The mask pattern 565 may be formed of a photoresist material using a photolithography process. The mask pattern 565 may be formed such that the openings 565a expose portions of the second seed metal layer 570 and overlap with the even-numbered through electrodes 520y.

Figure 13:
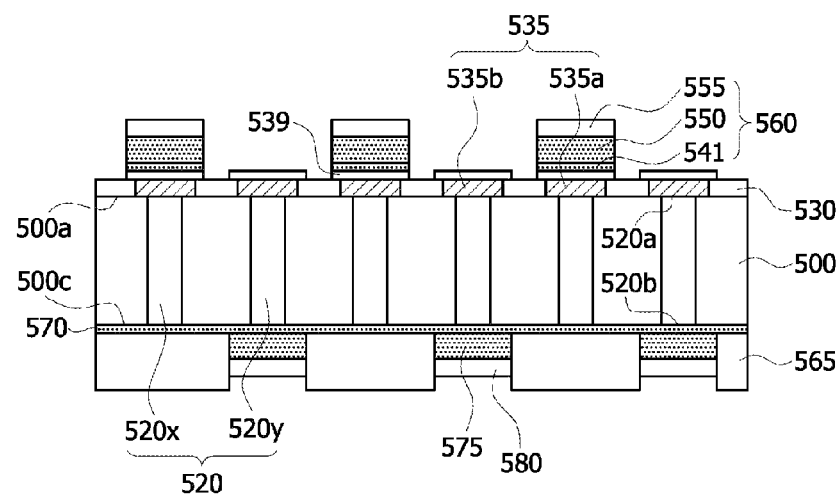

Referring to FIG. 13, a second metal layer 575 and a second contact metal layer 580 may be sequentially formed on each of the exposed portions of the second seed metal layer 570. The second metal layer 575 and the second contact metal layer 580 may be formed using an electroplating process. In such a case, the second metal layer 575 and the second contact metal layer 580 may be selectively grown on each of the exposed portions of the second seed metal layer 570. The second metal layer 575 may be formed to include a copper (Cu) material, and the second contact metal layer 580 may be formed to include a silver (Ag) material or a tin (Sn) material.

Figure 14:
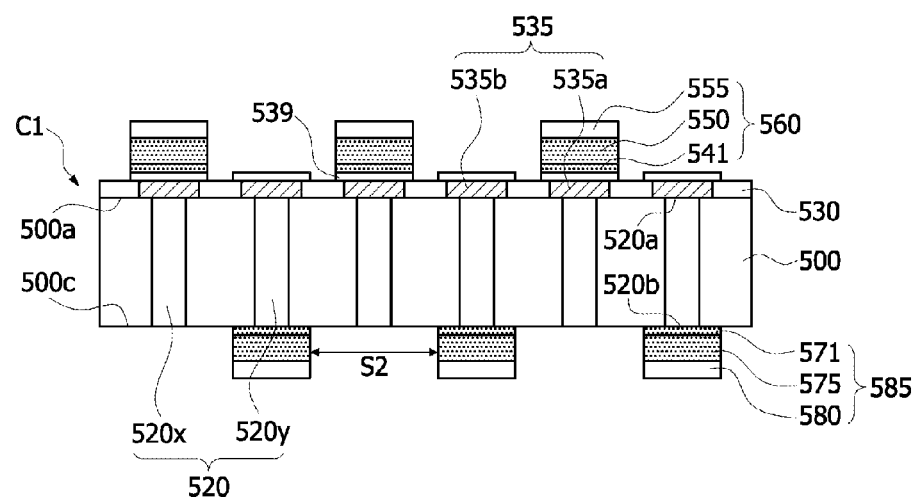

Referring to FIG. 14, the mask pattern (565 of FIG. 13) may be removed to expose portions of the second seed metal layer 570. Subsequently, the exposed portions of the second seed metal layer 570 may be etched to form second seed metal patterns 571. As a result, backside bumps 585 may be formed on the second end surfaces 520b of the even-numbered through electrodes 520y, respectively. Each of the backside bumps 585 may include the second seed metal pattern 571, the second metal layer 575 and the second contact metal layer 580 which are sequentially stacked on any one of the second end surfaces 520b of the even-numbered through electrodes 520y.

The backside bumps 585 may be electrically connected to the even-numbered through electrodes 520y, respectively. Because the backside bumps 585 are formed on the second end surfaces 520b of the even-numbered through electrodes 520y, the second end surfaces 520b of the odd-numbered through electrodes 520x may be exposed. Thus, spaces defined by a second distance S2 may be provided between the backside bumps 585.

According to the aforementioned processes, a first semiconductor chip C1 including the front-side bumps 560 electrically connected to the odd-numbered through electrodes 520x and the backside bumps 585 electrically connected to the even-numbered through electrodes 520y may be provided. Moreover, the front-side bumps 560 may be formed only on the first surface 500a of the semiconductor substrate 500, and the backside bumps 585 may be formed only on the second surface 500b of the semiconductor substrate 500. Thus, the front-side bumps 560 may not overlap with the backside bumps 585 in a plan view. That is, each of the through electrodes 520 may be electrically connected to only any one of the front-side bumps 560 and the backside bumps 585 of a given chip.

According to the aforementioned processes, the backside bumps 585 may be formed after the front-side bumps 560 are formed. However, embodiments are not limited to the aforementioned processes. For example, a seed metal layer may be formed on the first and second surfaces 500a and 500b of the semiconductor substrate 500, and a front-side mask pattern and a backside mask pattern may be respectively formed on the first surface 500a and the second surface 500b to define regions where the front-side bumps 560 and the backside bumps 585 are formed. Subsequently, the first and second metal layers 550 and 575 and the first and second contact metal layers 555 and 580 may be sequentially formed using a electroplating process, and the front-side mask pattern and the backside mask pattern may be removed.

In such a case, the front-side bumps 560 and the backside bumps 585 may be simultaneously formed on the first surface 500a and the second surface 500b, respectively. Moreover, after the backside bumps 585 are formed, additional diffusion barrier patterns (not shown) may be formed on the second end surfaces 520b of the odd-numbered through electrodes 520x, respectively. The additional diffusion barrier patterns may include the same material (e.g., a nickel material) as the diffusion barrier patterns 539.

Figure 15:
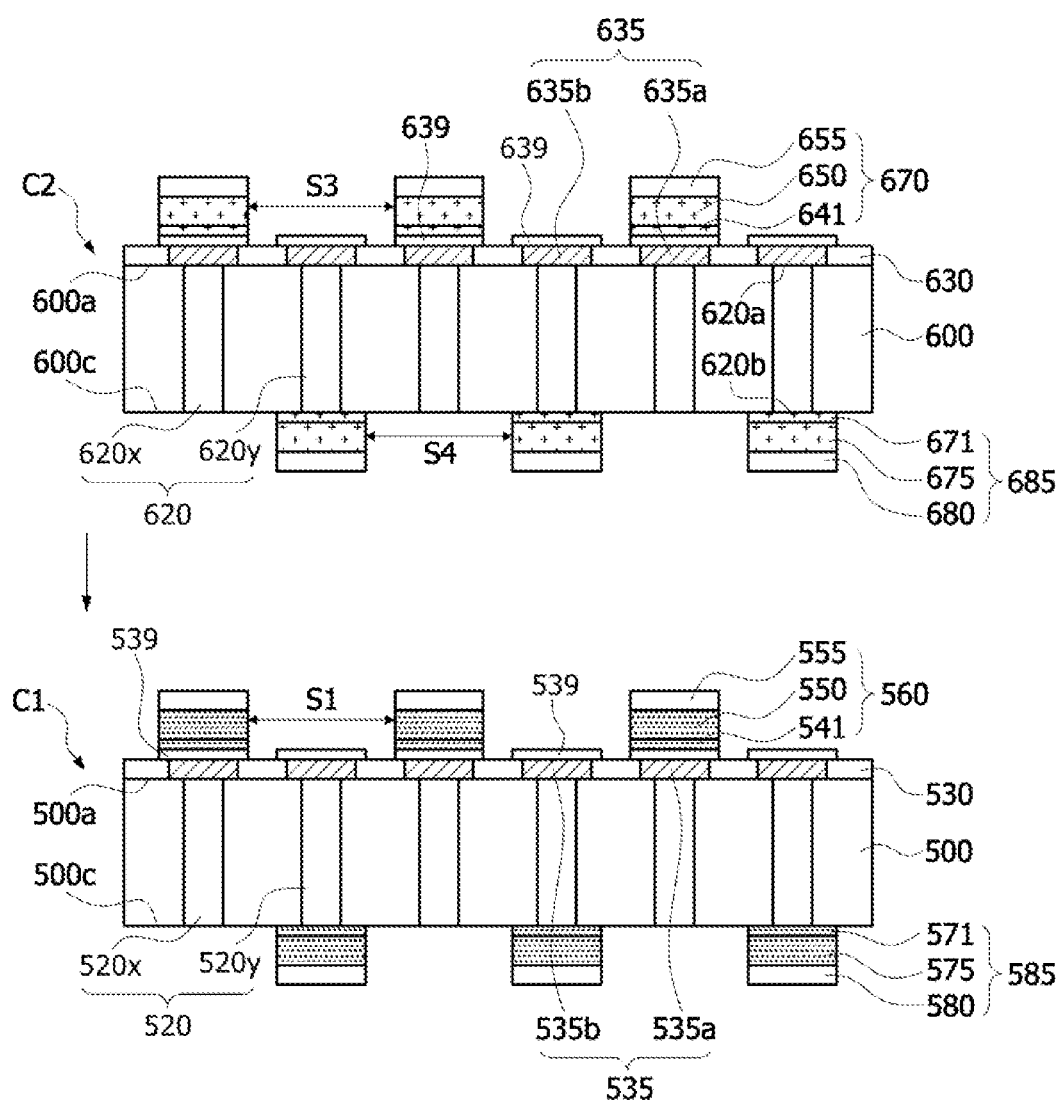

Referring to FIG. 15, a second semiconductor chip C2 may be provided. The second semiconductor chip C2 may be manufactured using the same method as described with reference to FIGS. 5 to 14. Thus, a method of manufacturing the second semiconductor chip C2 will not be repeated here. The second semiconductor chip C2 may include a semiconductor substrate 600 having a first surface 600a and a second surface 600b that are opposite to each other, a plurality of through electrodes 620 that penetrate the semiconductor substrate 600, front-side bumps 670 disposed on the first surface 600a of the semiconductor substrate 600 and electrically connected to odd-numbered through electrodes 620x among the plurality of through electrodes 620, and backside bumps 685 disposed on the second surface 600b of the semiconductor substrate 600 and electrically connected to even-numbered through electrodes 620y among the plurality of through electrodes 620.

An insulation layer 630 may be disposed on the first surface 600a of the semiconductor substrate 600. Contact pads 635 may be disposed in the insulation layer 630 and may be electrically connected to first end surfaces 620a of the through electrodes 620. The contact pads 635 may include first contact pads 635a and second contact pads 635b which are alternately arrayed.

The first contact pads 635a among the contact pads 635 may be electrically connected to the front-side bumps 670 which are connected to the odd-numbered through electrodes 620x, respectively. Each of the front-side bumps 670 may include a first seed metal pattern 641, a first metal layer 650 and a first contact metal layer 655 which are sequentially stacked on any one of the first contact pads 635a. Each of the backside bumps 685 may include a second seed metal pattern 671, a second metal layer 675 and a second contact metal layer 680 which are sequentially stacked on any one of second end surfaces 620b of the even-numbered through electrodes 620y. Diffusion barrier patterns 639 may be disposed on the second contact pads 635b, respectively. Because the front-side bumps 670 are disposed on the first end surfaces 620a of the odd-numbered through electrodes 620x, spaces defined by a first distance S3 may be provided between the front-side bumps 670. Moreover, because the backside bumps 685 are disposed on the second end surfaces 620b of the even-numbered through electrodes 620y, spaces defined by a second distance S4 may be provided between the backside bumps 685.

The second semiconductor chip C2 may be disposed on the first semiconductor chip C1. The second semiconductor chip C2 may be disposed on the first semiconductor chip C1 such that the recessed second surface 600c of the second semiconductor chip C2 faces the first surface 500a of the first semiconductor chip C1. More specifically, the second semiconductor chip C2 may be vertically aligned with the first semiconductor chip C1 so that the second end surfaces 620b of the odd-numbered through electrodes 620x of the second semiconductor chip C2 face the front-side bumps 560 of the first semiconductor chip C1 and the backside bumps 685 of the second semiconductor chip C2 face the second contact pads 535b of the first semiconductor chip C1. Accordingly, if the second semiconductor chip C2 is combined with the first semiconductor chip C1, the backside bumps 685 of the second semiconductor chip C2 may be disposed in spaces between the front-side bumps 560 of the first semiconductor chip C1.

Figure 16:
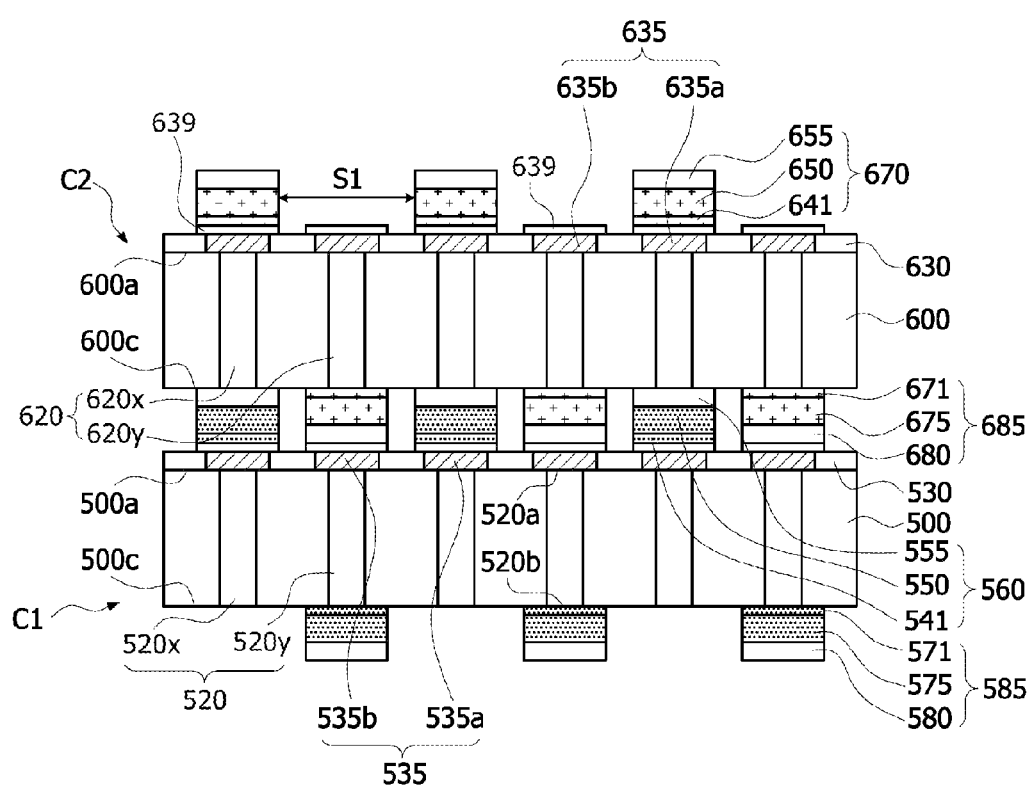

Referring to FIG. 16, the second semiconductor chip C2 may be combined with the first semiconductor chip C1. As a result, the front-side bumps 560 of the first semiconductor chip C1 may be bonded to the second end surfaces 620b of the odd-numbered through electrodes 620x of the second semiconductor chip C2, and the backside bumps 685 of the second semiconductor chip C2 may be bonded to the diffusion barrier patterns 539 of the first semiconductor chip C1. The diffusion barrier patterns 539 may prevent the second contact metal layers 680 formed of a solder material from being directly bonded to the even-numbered through electrodes 520y formed of a copper material.

In an embodiment, in each semiconductor device, front-side bumps may be formed on first end surfaces of odd-numbered through electrodes and backside bumps may be formed on second end surfaces of even-numbered through electrodes disposed between the odd-numbered through electrodes. Thus, the spaces provided between first metal layers constituting the front-side bumps are large enough that a sufficient quantity of etchant may be uniformly supplied onto a seed metal layer exposed between the first metal layers. Accordingly, portions of the seed metal layer exposed between the first metal layers may be completely removed to successfully form the front-side bumps. Moreover, in a semiconductor package including first and second semiconductor devices (also, referred to as first and second semiconductor chips), diffusion barrier patterns may be disposed between even-numbered through electrodes of the first semiconductor device and backside bumps of the second semiconductor device. Thus, the diffusion barrier patterns may prevent copper atoms in the even-numbered through electrodes of the first semiconductor device from being diffused into the backside bumps (including a solder material) of the second semiconductor device.

Figure 17:
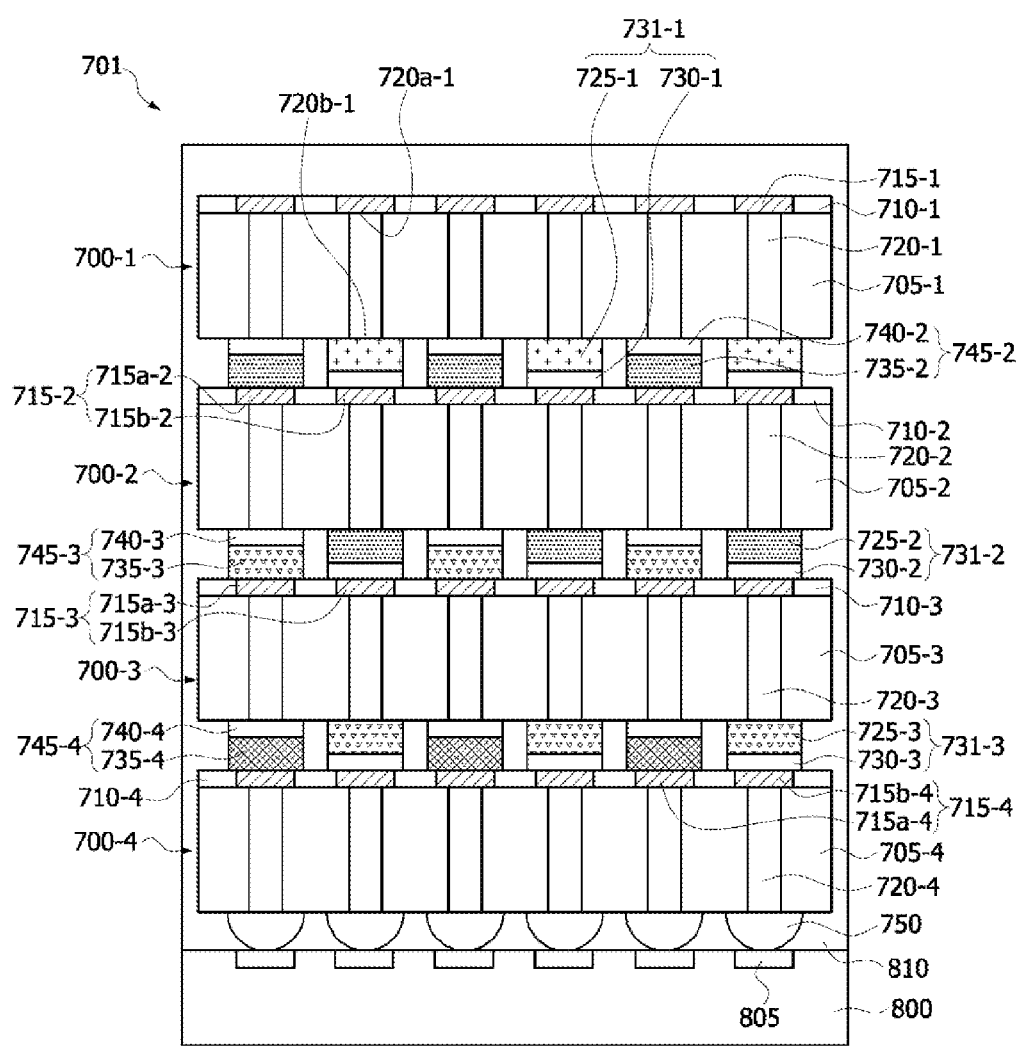
FIG. 17 is a cross-sectional view illustrating a semiconductor package manufactured to include a semiconductor device according to an embodiment.

Another stack semiconductor package according to an embodiment will be described hereinafter with reference to FIG. 17. The stacked semiconductor package may include two or more semiconductor chips. In FIG. 17, the stacked semiconductor package 701 will be described in conjunction with an example in which four semiconductor chips are stacked.

Referring to FIG. 17, the stacked semiconductor package 701 may include fourth, third, second and first semiconductor chips 700-4, 700-3, 700-2 and 700-1 which are sequentially stacked on a package substrate 800. That is, the fourth semiconductor chip 700-4 may correspond to a lowermost semiconductor chip which is attached to pads 805 of the package substrate 800 using connection members 750. Although not shown in the drawing, the package substrate 800 may include a plurality of interconnection lines.

Each of the first to fourth semiconductor chips 700-1, 700-2, 700-3 and 700-4 may include a semiconductor substrate 705-1, 705-2, 705-3 or 705-4 and through electrodes 720-1, 720-2, 720-3 or 720-4 penetrating the semiconductor substrate 705-1, 705-2, 705-3 or 705-4. In addition, each of the second to fourth semiconductor chips 700-2, 700-3 and 700-4 may include front-side bumps 745-2, 745-3 or 745-4 which are electrically connected to odd-numbered through electrodes thereof, and each of the first to third semiconductor chips 700-1, 700-2 and 700-3 may include backside bumps 731-1, 731-2 or 731-3 which are electrically connected to even-numbered through electrodes thereof. In another embodiment, the front side bumps are electrically connected to even-numbered through electrodes, and the back side bumps are electrically connected to odd-numbered through electrodes.

First end surfaces of the through electrodes 720-1, 720-2, 720-3 or 720-4 may be connected to contact pads 715-1, 715-2, 715-3 or 715-4. The contact pads 715-2, 715-3 or 715-4 may include first contact pads 715a-2, 715a-3 or 715a-4 which are electrically connected to the odd-numbered through electrodes and second contact pads 715b-2, 715b-3 or 715b-4 which are electrically connected to the even-numbered through electrodes. That is, the first contact pads 715a-2, 715a-3 or 715a-4 and the second contact pads 715b-2, 715b-3 or 715b-4 may be alternately arrayed. The contact pads 715-1, 715-2, 715-3 or 715-4 may be disposed in an insulation layer 710-1, 710-2, 710-3 or 710-4. The first to fourth semiconductor chips 700-1, 700-2, 700-3 and 700-4 may be encapsulated by a sealing material, for example, an epoxy molding compound (EMC) material.

Each of the front-side bumps 745-2, 745-3 or 745-4 connected to the through electrodes 720-2, 720-3 or 720-4 may include a first metal layer 735-2, 735-3 or 735-4 stacked on a first contact metal layer 740-2, 740-3 or 740-4. Each of the backside bumps 731-1, 731-2 or 731-3 may include a second metal layer 725-1, 725-2 or 725-3 stacked on a second contact metal layer 730-1, 730-2 or 730-3.

The semiconductor package according to the present embodiment may be configured to have a structure in which the backside bumps of an upper semiconductor chip are disposed in spaces between the front-side bumps of a lower semiconductor chip. For example, the through electrodes 720-3 of the third semiconductor chip 700-3 may be alternately connected to the first contact pads 715a-3 and the second contact pads 715b-3. The front-side bumps 745-3 of the third semiconductor chip 700-3 may be disposed on the first contact pads 715a-3 connected to the odd-numbered through electrodes of the third semiconductor chip 700-3. In such an embodiment, the second contact pads 715b-3 of the third semiconductor chip 700-3 may be connected to the backside bumps 731-2 of the second semiconductor chip 700-2 which is stacked on the third semiconductor chip 700-3. Furthermore, the odd-numbered through electrodes 720-3 of the third semiconductor chip 700-3 may be connected to the front-side bumps 745-4 of the fourth semiconductor chip 700-4.

At least one of the semiconductor devices described above may be applied to various electronic systems.

Figure 18:
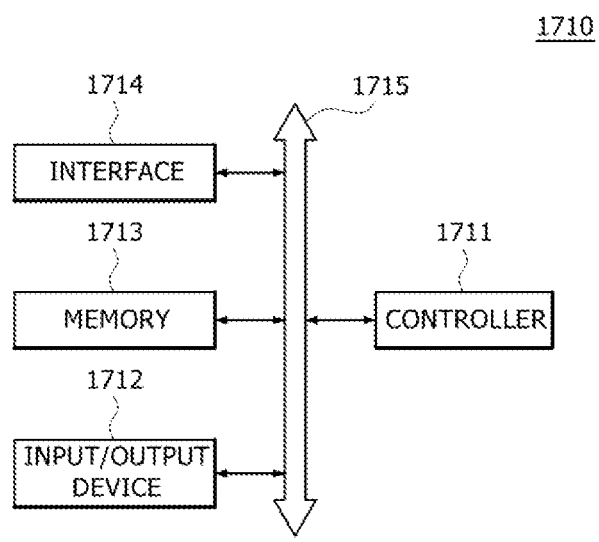
FIG. 18 is a block diagram illustrating an electronic system including at least one of semiconductor devices according to some embodiments.

Referring to FIG. 18, a semiconductor device in accordance with an embodiment may be applied to an electronic system 1710. The electronic system 1710 may include a controller 1711, an input/output unit 1712, and a memory 1713. The controller 1711, the input/output unit 1712, and the memory 1713 may be coupled with one another through a bus 1715 providing a path through which data moves.

For example, the controller 1711 may include any one of at least one microprocessor, at least one digital signal processor, at least one microcontroller, and logic devices capable of performing the same functions as these components. The controller 1711 and the memory 1713 may include at least one of the semiconductor devices according to an embodiment of the present disclosure. The input/output unit 1712 may include at least one selected among a keypad, a keyboard, a display device, a touch screen and so forth. The memory 1713 is a device for storing data. The memory 1713 may store data and/or commands to be executed by the controller 1711, and the like.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 1710 may stably store a large amount of data in a flash memory system.

The electronic system 1710 may further include an interface 1714 configured to transmit and receive data to and from a communication network. The interface 714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment wherein the electronic system 1710 is an equipment capable of performing wireless communication, the electronic system 1710 may be used in a communication system such as a system employing one or more of CDMA (code division multiple access), GSM (global system for mobile communications), NADC (North American digital cellular), E-TDMA (enhanced-time division multiple access), WCDAM (wideband code division multiple access), CDMA2000, LTE (long term evolution) and Wibro (wireless broadband Internet).

Figure 19:
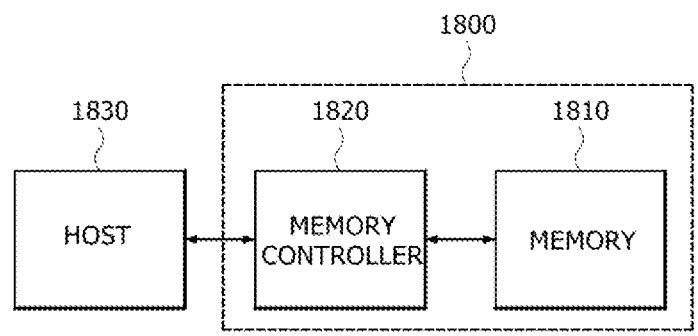
FIG. 19 is a block diagram illustrating another electronic system including at least one of semiconductor devices according to some embodiments.

Referring to FIG. 19, a semiconductor device in accordance with an embodiment may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least one nonvolatile memory device to which the packaging technology of an embodiment of the present disclosure is applied. The memory controller 1820 may control the memory 1810 such that stored data is read out or data is stored in response to a read/write request from a host 1830.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A semiconductor package comprising:
a first semiconductor chip including:
a first substrate having a first surface and a second surface that are opposite to each other;
a plurality of first through electrodes penetrating the first substrate and being spaced apart from each other;
a plurality of first front-side bumps disposed on the first surface of the first substrate and connected to first odd-numbered through electrodes among the first through electrodes;
a plurality of first backside bumps disposed on the second surface of the first substrate and connected to first even-numbered through electrodes among the first through electrodes; and
a second semiconductor chip including:
a second substrate having a first surface and a second surface that are opposite to each other;
a plurality of second through electrodes penetrating the second substrate and being spaced apart from each other;
a plurality of second front-side bumps disposed on the first surface of the second substrate and connected to second odd-numbered through electrodes among the second through electrodes; and
a plurality of second backside bumps disposed on the second surface of the second substrate and connected to second even-numbered through electrodes among the second through electrodes,
wherein the first and second semiconductor chips are combined with each other so that the first surface of the first substrate faces the second surface of the second substrate.

2. The semiconductor package of claim 1,
wherein the second backside bumps are electrically connected to the second even-numbered through electrodes, and
wherein the first front-side bumps are electrically connected to the first odd-numbered through electrodes.

3. The semiconductor package of claim 1,
wherein each of the first front-side bumps includes a first metal layer and a first contact metal layer which are sequentially stacked on one of the first odd-numbered through electrodes, and
wherein each of the first backside bumps includes a second metal layer and a second contact metal layer which are sequentially stacked on one of the first even-numbered through electrodes.

4. The semiconductor package of claim 1,
wherein each of the second front-side bumps includes a third metal layer and a third contact metal layer which are sequentially stacked on one of the second odd-numbered through electrodes, and
wherein each of the second backside bumps includes a fourth metal layer and a fourth contact metal layer which are sequentially stacked on one of the second even-numbered through electrodes.

5. The semiconductor package of claim 3, wherein the first contact metal layers of the first front-side bumps contact the second semiconductor chip.

6. The semiconductor package of claim 3, wherein the first contact metal layers of the first front-side bumps are electrically connected to the second odd-numbered through electrodes.

7. The semiconductor package of claim 4, wherein the fourth contact metal layers of the second backside bumps contact the first semiconductor chip.

8. The semiconductor package of claim 4, wherein the fourth contact metal layers of the second backside bumps are electrically connected to the first even-numbered through electrodes.

9. The semiconductor package of claim 1,
wherein the first semiconductor chip further includes:
a first insulation layer disposed on the first surface of the first substrate; and
a plurality of conductive contact pads disposed in the first insulation layer and being in contact with the first through electrodes,
wherein the second semiconductor chip further includes:
a second insulation layer disposed on the first surface of the second substrate; and
a plurality of conductive contact pads disposed in the second insulation layer and being in contact the second through electrodes,
wherein the first surfaces of the first and second substrates are front-side surfaces of the first and second substrates adjacent to active regions defined in the first and second substrates,
wherein the second surfaces of the first and second substrates are backside surfaces of the first and second substrates,
wherein the first front-side bumps are disposed on the contact pads of the first semiconductor chip, and
wherein the second front-side bumps are disposed on the contact pads of the second semiconductor chip.

10. The semiconductor package of claim 9,
wherein the contact pads of the first semiconductor chip include first contact pads connected to the first odd-numbered through electrodes and second contact pads connected to the first even-numbered through electrodes, and
wherein the contact pads of the second semiconductor chip include third contact pads electrically connected to the second odd-numbered through electrodes and fourth contact pads electrically connected to the second even-numbered through electrodes.

11. The semiconductor package of claim 10, wherein each of the first and second semiconductor chips further includes first diffusion barrier patterns that are disposed on each of the first, second, third and fourth contact pads.

12. The semiconductor package of claim 11, wherein each of the first diffusion barrier patterns includes a nickel material.

13. The semiconductor package of claim 11, wherein the second backside bumps contact the first diffusion barrier patterns of the first semiconductor chip.

14. The semiconductor package of claim 3, wherein each of the first and second semiconductor chips further includes second diffusion barrier patterns that are disposed on the second surface and cover the odd-numbered through electrodes.

15. The semiconductor package of claim 14, wherein the first contact metal layers of the first front-side bumps contact the second diffusion barrier patterns of the second semiconductor chip.

16. The semiconductor package of claim 13, wherein each of the second diffusion barrier patterns includes a nickel material.

\* \* \* \* \*